United States Patent
Li et al.

(10) Patent No.: US 11,581,509 B2
(45) Date of Patent: Feb. 14, 2023

(54) DISPLAY PANEL INCLUDING FLUORO-POLYMERIC LAYER

(71) Applicant: BOE Technology Group Co., Ltd., Beijing (CN)

(72) Inventors: Xin Li, Beijing (CN); Xing Fan, Beijing (CN); Liangyu Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 51 days.

(21) Appl. No.: 16/930,334

(22) Filed: Jul. 16, 2020

(65) Prior Publication Data

US 2021/0135157 A1  May 6, 2021

(30) Foreign Application Priority Data

Oct. 30, 2019 (CN) .......................... 201911045790.4

(51) Int. Cl.
| | | |
|---|---|---|
| *H01L 51/00* | (2006.01) | |
| *H01L 51/52* | (2006.01) | |
| *G02F 1/13* | (2006.01) | |
| *H01L 51/56* | (2006.01) | |
| *G02F 1/1335* | (2006.01) | |

(52) U.S. Cl.
CPC ...... *H01L 51/5253* (2013.01); *H01L 51/0096* (2013.01); *H01L 51/56* (2013.01); *G02F 1/133528* (2013.01); *H01L 51/5293* (2013.01); *H01L 2251/301* (2013.01)

(58) Field of Classification Search
CPC ............. H01L 51/5253; H01L 51/0096; H01L 51/5275; H01L 51/5281; H01L 51/5284; H01L 51/5256; H01L 51/5293; H01L 2251/301; G02F 1/133528
See application file for complete search history.

(56) References Cited

U.S. PATENT DOCUMENTS

| | | | |
|---|---|---|---|
| 5,107,175 A | * | 4/1992 | Hirano .................. H05B 33/04 428/917 |
| 5,593,794 A | | 1/1997 | Wei et al. |
| 9,977,234 B1 | * | 5/2018 | Van Der Gaag ...... G03F 7/2002 |

(Continued)

FOREIGN PATENT DOCUMENTS

| | | |
|---|---|---|
| CN | 1176696 A | 3/1998 |
| CN | 1348609 A | 5/2002 |

(Continued)

OTHER PUBLICATIONS

Office Action dated Aug. 17, 2021 for Chinese Patent Application No. 201911045790.4 and English Translation.

*Primary Examiner* — Ida M Soward
(74) *Attorney, Agent, or Firm* — Ling Wu; Stephen Yang; Ling and Yang Intellectual Property

(57) ABSTRACT

A display panel includes a light-emitting device on a substrate and an encapsulation structure on a light output surface on one side of the light-emitting device. The encapsulation structure includes a first inorganic layer and a fluoro-polymeric layer. Ductility and bending resistance of the fluoro-polymeric layer are greater than those of the first inorganic layer. Defects between the fluoro-polymeric layer and the first inorganic layer are fewer than those between the first inorganic layer and another layer.

14 Claims, 4 Drawing Sheets

(56) References Cited

U.S. PATENT DOCUMENTS

| | | |
|---|---|---|
| 10,078,212 B1 * | 9/2018 | Sakai .................. H01L 27/1248 |
| 10,288,871 B1 * | 5/2019 | Kumar ................ H01L 27/1218 |
| 10,338,374 B1 * | 7/2019 | Guntaka ................ G02B 5/003 |
| 2002/0140347 A1 * | 10/2002 | Weaver ............... H01L 51/0097 |
| | | 313/506 |
| 2003/0117068 A1 | 6/2003 | Forrest et al. |
| 2003/0164497 A1 | 9/2003 | Carcia et al. |
| 2006/0063015 A1 | 3/2006 | McCormick et al. |
| 2006/0181662 A1 * | 8/2006 | Kameyama ....... G02F 1/133528 |
| | | 349/117 |
| 2007/0132375 A1 | 6/2007 | Bachmann et al. |
| 2010/0117522 A1 * | 5/2010 | Park ....................... C07H 15/18 |
| | | 428/458 |
| 2011/0128477 A1 * | 6/2011 | Izaki ................... H01L 51/5253 |
| | | 349/96 |
| 2011/0209755 A1 * | 9/2011 | Zimmerman .......... C09K 19/38 |
| | | 156/244.11 |
| 2012/0012827 A1 * | 1/2012 | Horiuchi ............. H01L 51/0058 |
| | | 257/E51.027 |
| 2014/0117341 A1 | 5/2014 | Song et al. |
| 2014/0159002 A1 | 6/2014 | Lee et al. |
| 2015/0042346 A1 | 2/2015 | Oh et al. |
| 2015/0376468 A1 | 12/2015 | Cho et al. |
| 2015/0380683 A1 | 12/2015 | You |
| 2016/0111684 A1 * | 4/2016 | Savas .................... C23C 16/345 |
| | | 438/26 |
| 2017/0101556 A1 * | 4/2017 | Keite-Telgenbüscher et al. ......... |
| | | H01L 51/004 |

FOREIGN PATENT DOCUMENTS

| | | |
|---|---|---|
| CN | 1879238 A | 12/2006 |
| CN | 101027798 A | 8/2007 |
| CN | 203258803 U | 10/2013 |
| CN | 103490019 A | 1/2014 |
| CN | 103794631 A | 5/2014 |
| CN | 103872078 A | 6/2014 |
| CN | 104347822 A | 2/2015 |
| CN | 105121581 A | 12/2015 |
| CN | 106229420 A | 12/2016 |
| CN | 109804482 A | 5/2019 |
| TW | 200533983 A | 10/2005 |
| WO | 2005076756 A2 | 8/2005 |
| WO | 2018042107 A1 | 3/2018 |

* cited by examiner

DISPLAY PANEL INCLUDING FLUORO-POLYMERIC LAYER

CROSS-REFERENCE TO RELATED APPLICATION

The present application claims the priority of Chinese Patent Application No. 201911045790.4 filed to the CNIPA on Oct. 30, 2019, the content of which is hereby incorporated by reference.

TECHNICAL FIELD

The present application relates to, but is not limited to, the field of display technology, in particular to a display panel, a manufacturing method thereof and a display apparatus.

BACKGROUND

An organic light-emitting device or an organic light-emitting diode (OLED) is used as a novel flat panel display. As compared to a liquid crystal display (LCD), the OLED has advantages such as thinness, light weight, wide viewing angle, self-luminescence, continuously adjustable emitting color, low cost, fast response speed, low energy consumption, low driving voltage, wide range of operating temperature, simple production process, high illuminating efficiency, and flexible display. The OLED has attracted immense industrial and scientific attentions by virtue of its incomparable advantages and promising application prospects over other displays.

However, due to the existence of an organic light-emitting layer in the organic light-emitting device, the organic light-emitting device is sensitive to moisture and oxygen. Once moisture and oxygen enter the organic light-emitting layer, the service life of the organic light-emitting device will be drastically affected. For a display panel in the related art, it is necessary to arrange an encapsulation structure on the organic light-emitting device. In the encapsulation structure, an encapsulation layer is made of micron-sized silicon oxide and silicon oxynitride. As inorganic films are used, the bending resistance of the organic light-emitting device is limited to some extent, and the encapsulation layer is prone to be stripped due to certain defects.

Therefore, how to increase the bending resistance of the light-emitting device while the encapsulation structure is guaranteed for blocking moisture and oxygen is a technical problem that needs to be solved urgently for those skilled in the art.

SUMMARY

The following is a summary of the subject matter described in detail in the present application. This summary is not intended to limit the scope of the claims.

In one aspect, the present application provides a display panel including a light-emitting device on a substrate and an encapsulation structure on a light output surface on one side of the light-emitting device.

The encapsulation structure includes a first inorganic layer for blocking moisture and oxygen and a fluoro-polymeric layer for blocking moisture and oxygen sequentially arranged on the light-emitting device. Ductility and bending resistance of the fluoro-polymeric layer for blocking moisture and oxygen are greater than those of the first inorganic layer for blocking moisture and oxygen. Defects between the fluoro-polymeric layer for blocking moisture and oxygen and the first inorganic layer for blocking moisture and oxygen are fewer than those between the first inorganic layer for blocking moisture and oxygen and another layer for blocking moisture and oxygen. Thickness of the fluoro-polymeric layer for blocking moisture and oxygen and the first inorganic layer for blocking moisture and oxygen is less than that of the first inorganic layer for blocking moisture and oxygen and another layer for blocking moisture and oxygen. In addition, bonding force between the fluoro-polymeric layer for blocking moisture and oxygen and the first inorganic layer for blocking moisture and oxygen is greater than that between the first inorganic layer for blocking moisture and oxygen and another layer for blocking moisture and oxygen.

In an exemplary embodiment, the encapsulation structure further includes a second inorganic layer for blocking moisture and oxygen on one side, away from the light-emitting device, of the fluoro-polymeric layer for blocking moisture and oxygen. Defects between the fluoro-polymeric layer for blocking moisture and oxygen and the second inorganic layer for blocking moisture and oxygen are fewer than those between the second inorganic layer for blocking moisture and oxygen and another layer for blocking moisture and oxygen. Thickness of the fluoro-polymeric layer for blocking moisture and oxygen and the second inorganic layer for blocking moisture and oxygen is less than that of the second inorganic layer for blocking moisture and oxygen and another layer for blocking moisture and oxygen. In addition, bonding forces between the fluoro-polymeric layer for blocking moisture and oxygen and the first inorganic layer for blocking moisture and oxygen and between the fluoro-polymeric layer for blocking moisture and oxygen and the second inorganic layer for blocking moisture and oxygen are greater than those between the first inorganic layer for blocking moisture and oxygen and another layer for blocking moisture and oxygen and between the second inorganic layer for blocking moisture and oxygen and another layer for blocking moisture and oxygen.

In an exemplary embodiment, the thickness of both the first inorganic layer for blocking moisture and oxygen and the second inorganic layer for blocking moisture and oxygen is about 0.24 μm-1.2 μm.

In an exemplary embodiment, the thickness of the fluoro-polymeric layer for blocking moisture and oxygen is about 0.1 μm-5 μm.

In an exemplary embodiment, the display panel further includes a polarizing layer on one side, away from the light-emitting device, of the encapsulation structure.

In an exemplary embodiment, a material of the polarizing layer includes tetracene or F8BT.

In an exemplary embodiment, the fluoro-polymeric layer for blocking moisture and oxygen includes an ultraviolet absorber.

In an exemplary embodiment, the ultraviolet absorber is a photoinitiator-1173.

In an exemplary embodiment, a dopant concentration of the ultraviolet absorber is about 1%-20%.

In an exemplary embodiment, the display panel further includes a refractive layer between the light-emitting device and the encapsulation structure.

In an exemplary embodiment, the refractive layer is a single layer, or includes a plurality of layers with different refractive indices.

In another aspect, the present application provides a manufacturing method of a display panel. The manufacturing method includes: providing a substrate, and forming a light-emitting device on the substrate; forming a first inorganic layer for blocking moisture and oxygen on a light output surface on one side of the light-emitting device; and forming a fluoro-polymeric layer for blocking moisture and oxygen on the first inorganic layer for blocking moisture and oxygen.

In an exemplary embodiment, act of forming the fluoro-polymeric layer for blocking moisture and oxygen on the first inorganic layer for blocking moisture and oxygen includes: mixing a chloro-trifluoro-ethylene vinyl ether resin and a difunctional methacrylic perfluoropolyether oligomer in a predefined mass ratio into a chloroform solvent to form a precursor solution of a fluoro-polymer; adding an ultra-violet absorber in a predefined mass fraction into the prepared precursor solution of the fluoro-polymer, and uniformly dispersing the ultraviolet absorber; and forming a film uniformly on the first inorganic layer for blocking moisture and oxygen with a solution in which the ultraviolet absorber is dissolved so as to form the fluoro-polymeric layer for blocking moisture and oxygen.

In an exemplary embodiment, the predefined mass ratio is about 98:2.

In an exemplary embodiment, the predefined mass fraction is about 3%.

In an exemplary embodiment, the method further includes: forming an oriented polarizing layer on one side, away from the light-emitting device, of the fluoro-polymeric layer for blocking moisture and oxygen.

In an exemplary embodiment, act of forming the oriented polarizing layer on one side, away from the light-emitting device, of the fluoro-polymeric layer for blocking moisture and oxygen includes: forming the polarizing layer by preparing oriented tetracene using light-directed molecular self-assembly, or forming the polarizing layer by preparing F8BT using unidirectional blade-coating.

In another aspect, the present application provides a display apparatus including any of the above display panels.

Other features and advantages of the present application will be set forth in the following description, and in part will become apparent from the description, or be learned by practice of the present application. Purposes and advantages of the present application may be realized and acquired by structures specified in the specification, claims and drawings.

DETAILED DESCRIPTION

Figure 1:
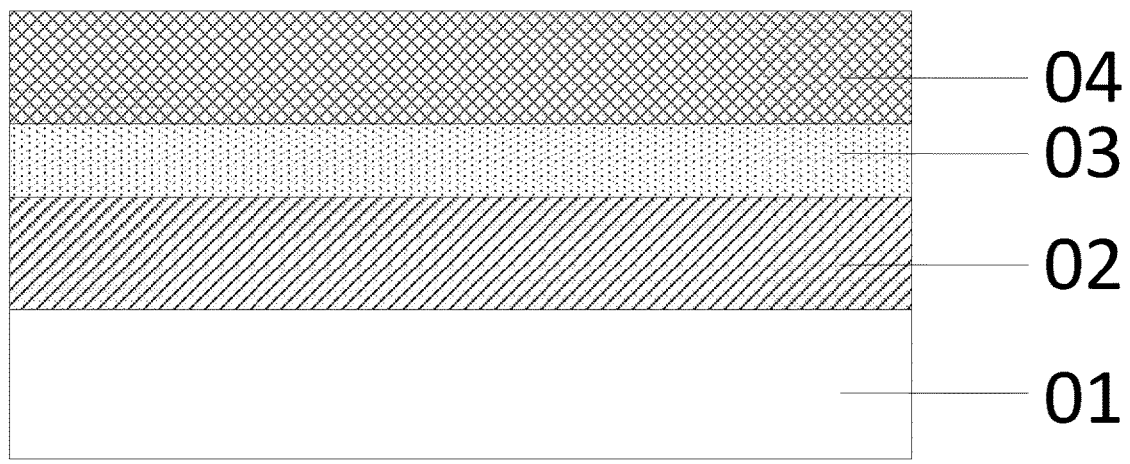
FIG. 1 is a schematic structural diagram of a display panel.

A display panel, as shown in FIG. 1, may include an organic light-emitting device 01 on a substrate and an encapsulation structure on a light output surface on one side of the organic light-emitting device 01. The encapsulation structure includes a first inorganic thin layer 02, an organic thin layer 03 and a second inorganic thin layer 04 sequentially arranged on the organic light-emitting device 01. The first inorganic thin layer 02 and the second inorganic thin layer 04 have functions for blocking moisture and oxygen, but the organic thin layer 03 does not have a function for blocking moisture and oxygen. The organic thin layer 03 is arranged to increase the bonding force between the first inorganic thin layer 02 and the second inorganic thin layer 04 and to cover the particle defects on the surfaces of the first inorganic thin layer 02 and the second inorganic thin layer 04. Therefore, the above encapsulation structure blocks the moisture and oxygen merely by means of the inorganic thin layers. Thus the first inorganic thin layer 02 and the second inorganic thin layer 04 would be set to be relatively thick in order to guarantee the function for blocking moisture and oxygen. As a result, the bending resistance of the organic light-emitting device including such an encapsulation structure is poor. In this case, the thickness of the organic thin layer 03 is about 8-10 μm.

In view of the above problem existing in the display panel, embodiments of the present application provide a display panel, a manufacturing method thereof and a display apparatus.

In order to make the objects, technical solution and advantages of the present application become more apparent, particular implementation of the display panel, the manufacturing method thereof and the display apparatus provided by the embodiments of the present application will be described in detail below with reference to the drawings. It should be understood that preferred embodiments described below are merely intended to illustrate and explain the present application, and are not intended to limit the present application. Moreover, the embodiments in the present application and features in the embodiments may be combined with each other without conflict.

Unless otherwise defined, technical terms or scientific terms used in the present application shall have the ordinary meaning construed by those with ordinary skills in the art to which the present application pertains. The words "first", "second" and the like used in the present application do not indicate any order, quantity or importance, but are merely used to distinguish among different components. Similar words such as "including" or "comprising" mean that the elements or articles preceding such a word cover elements or articles listed after the word and their equivalents, and do not exclude other elements or articles. Similar words such as "connect" or "link" are not limited to physical or mechanical connections, but may include electrical connections, whether direct or indirect. "Up", "down", "left", "right" and the like are merely used to indicate a relative positional relationship. Upon the change of an absolute position of a described object, the relative positional relationship may also change accordingly.

In addition, "about" in the present application refers to a value within the allowable error range of a process and measurement without strictly defining the limit.

The shape and dimension of each component in the drawings are not drawn to actual proportions, and are merely for the purpose of schematically illustrating the content of the present application.

Figure 2:
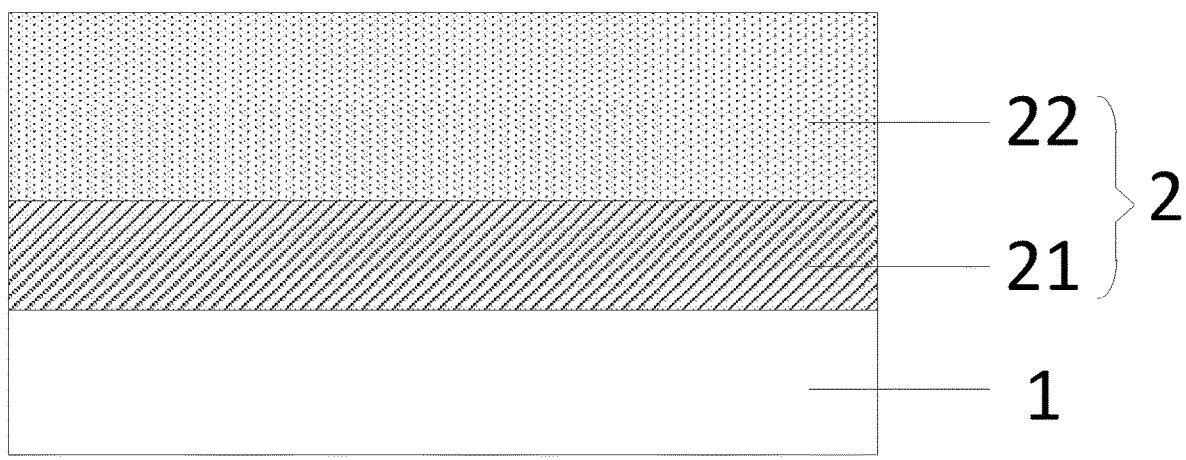
FIG. 2 is a first schematic structural diagram of a display panel according to an embodiment of the present application.

As shown in FIG. 2, an embodiment of the present application provides a display panel including a light-emitting device 1 on a substrate and an encapsulation structure 2 on a light output surface on one side of the light-emitting device 1.

The encapsulation structure 2 includes a first inorganic layer for blocking moisture and oxygen 21 and a fluoro-polymeric layer for blocking moisture and oxygen 22 sequentially arranged on the light-emitting device 1.

In an exemplary embodiment, ductility and bending resistance of the fluoro-polymeric layer for blocking moisture and oxygen are greater than those of the first inorganic layer for blocking moisture and oxygen; defects between the fluoro-polymeric layer for blocking moisture and oxygen and the first inorganic layer for blocking moisture and oxygen are smaller/fewer than those between the first inorganic layer for blocking moisture and oxygen and another layer for blocking moisture and oxygen; thickness of the fluoro-polymeric layer for blocking moisture and oxygen and the first inorganic layer for blocking moisture and oxygen is less than that of the first inorganic layer for blocking moisture and oxygen and another layer for blocking moisture and oxygen; and bonding force between the fluoro-polymeric layer for blocking moisture and oxygen and the first inorganic layer for blocking moisture and oxygen is greater than that between the first inorganic layer for blocking moisture and oxygen and another layer for blocking moisture and oxygen.

In an exemplary embodiment, the another layer for blocking moisture and oxygen may be a cross-linked fluorine-containing acrylate layer for blocking moisture and oxygen, a siloxane-modified polyurethane layer for blocking moisture and oxygen, or a polymer layer for blocking moisture and oxygen which is modified by other hydrophobic groups (such as amide, polyoxypropylene, long-chain perfluoroalkyl). A layer for blocking moisture and oxygen may be made of a material that meets the following conditions: 1. high density, such as having a cross-linked structure; 2. a material containing a hydrophobic group, or a material modified by a hydrophobic group; 3. a material that may be spin-coated or be printed in solution.

The display panel according to the embodiment of the present application includes a light-emitting device on a substrate and an encapsulation structure on a light output surface on one side of the light-emitting device. The encapsulation structure includes a first inorganic layer for blocking moisture and oxygen and a fluoro-polymeric layer for blocking moisture and oxygen sequentially arranged on the light-emitting device. The fluoro-polymeric layer for blocking moisture and oxygen is arranged on the first inorganic layer for blocking moisture and oxygen. Since the fluoro-polymeric layer for blocking moisture and oxygen is an organic layer, it has better ductility and bending resistance than the inorganic layer. Moreover, the fluoro-polymeric layer for blocking moisture and oxygen has a function for blocking moisture and oxygen, and can prevent the service life of the light-emitting device from being affected by moisture and oxygen. In addition, by virtue of the arrangement of the fluoro-polymeric layer for blocking moisture and oxygen, the thickness of the whole encapsulation structure or even the light-emitting devices in which it is located may be significantly decreased, and the bending resistance of the light-emitting device including the encapsulation structure may be improved.

In addition, the use of the fluoro-polymeric layer for blocking moisture and oxygen as the top structure of the encapsulation structure can prevent particles and defects generated in the preparation of the inorganic layers from being stripped or deficient in connection when the inorganic layers adhere to other module terminals.

In the display panel according to the embodiment of the present application, the fluoro-polymeric layer for blocking moisture and oxygen may be formed by a fluoro-polymer with a function for blocking moisture and oxygen. In an exemplary embodiment, a precursor solution of the fluoro-polymer may be formed by mixing chloro-trifluoro-ethylene vinyl ether resin (e.g., Lumiflon LF-910LM) and difunctional methacrylic perfluoropolyether oligomer (e.g., Fluorolink MD700) in a mass ratio of about 98:2 into a chloroform solvent.

The fluoro-polymeric layer for blocking moisture and oxygen may be formed by various coating methods, such as blade-coating, inkjet printing and the like.

Figure 3:
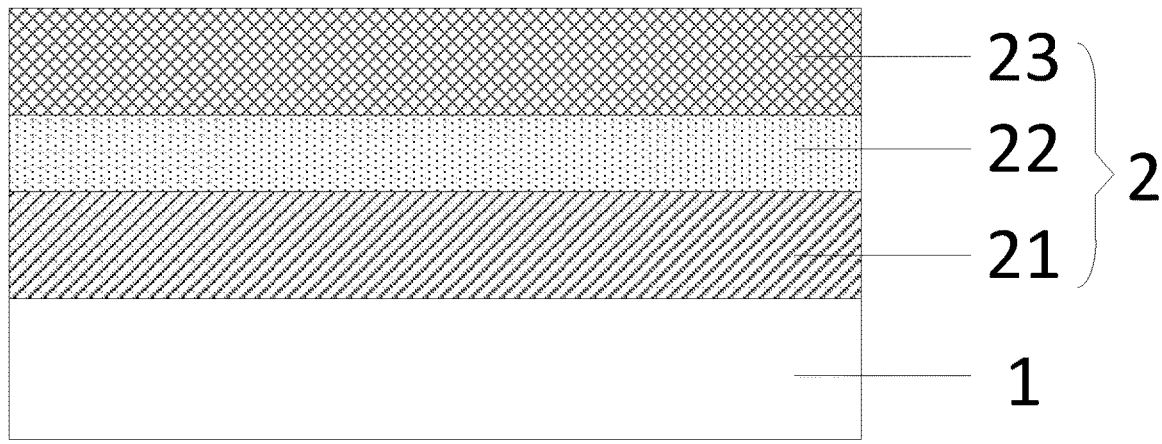
FIG. 3 is a second schematic structural diagram of a display panel according to an embodiment of the present application.

In the display panel according to the embodiment of the present application, as shown in FIG. 3, the encapsulation structure 2 may further include a second inorganic layer for blocking moisture and oxygen 23 on one side, away from the light-emitting device 1, of the fluoro-polymeric layer for blocking moisture and oxygen 22.

In an exemplary embodiment, defects between the fluoro-polymeric layer for blocking moisture and oxygen and the second inorganic layer for blocking moisture and oxygen are fewer than those between the second inorganic layer for blocking moisture and oxygen and another layer for blocking moisture and oxygen; thickness of the fluoro-polymeric layer for blocking moisture and oxygen and the second inorganic layer for blocking moisture and oxygen is less than that of the second inorganic layer for blocking moisture and oxygen and another layer for blocking moisture and oxygen; and bonding forces between the fluoro-polymeric layer for blocking moisture and oxygen and the first inorganic layer for blocking moisture and oxygen and between the fluoro-polymeric layer for blocking moisture and oxygen and the second inorganic layer for blocking moisture and oxygen are greater than those between the first inorganic layer for blocking moisture and oxygen and another layer for blocking moisture and oxygen and between the second inorganic layer for blocking moisture and oxygen and another layer for blocking moisture and oxygen.

In the display panel according to the embodiment of the present application, the encapsulation structure includes a first inorganic layer for blocking moisture and oxygen, a fluoro-polymeric layer for blocking moisture and oxygen and a second inorganic layer for blocking moisture and oxygen sequentially arranged on a light-emitting device. The organic layer between the first inorganic layer for blocking moisture and oxygen and the second inorganic layer for blocking moisture and oxygen may not only cover the particle defects of the first inorganic layer for blocking moisture and oxygen and the second inorganic layer for blocking moisture and oxygen, but also increase the bonding force between the first inorganic layer for blocking moisture and oxygen and the second inorganic layer for blocking moisture and oxygen. The organic layer also has a function for blocking moisture and oxygen, thereby increasing the capacity of blocking moisture and oxygen of the encapsulation structure.

In an exemplary embodiment, the thickness of the fluoro-polymeric layer for blocking moisture and oxygen is about 0.1 μm-5 μm. The thickness is significantly decreased, as compared to the organic thin layer 03 in FIG. 1.

In the display panel according to the embodiment of the present application, the thickness of both the first inorganic layer for blocking moisture and oxygen and the second inorganic layer for blocking moisture and oxygen may be about 0.24 μm-1.2 μm.

In the display panel according to the embodiment of the present application, in the case that the encapsulation structure includes the first inorganic layer for blocking moisture and oxygen, the fluoro-polymeric layer for blocking moisture and oxygen and the second inorganic layer for blocking moisture and oxygen sequentially arranged on the light-emitting device, the thickness of the first and the second inorganic layer for blocking moisture and oxygen may be appropriately decreased since the fluoro-polymeric layer for blocking moisture and oxygen has the capacity of blocking moisture and oxygen. If the thickness of each inorganic layer in the encapsulation structure is about 0.8 μm-2 μm, after the fluoro-polymeric layer for blocking moisture and oxygen is added, the thickness of the first inorganic layer for blocking moisture and oxygen and the second inorganic layer for blocking moisture and oxygen may be decreased to 30%-60% of the original thickness, which may meet the requirement of the capacity of blocking moisture and oxygen of the encapsulation structure. In other words, the thickness of both the first inorganic layer for blocking moisture and oxygen and the second inorganic layer for blocking moisture and oxygen is about 0.24 μm-1.2 μm, and this may meet the requirement of the capacity of blocking moisture and oxygen of the encapsulation structure. Decreasing the thickness of the inorganic layer is beneficial for improving the flexibility of the light-emitting device.

Figure 4:
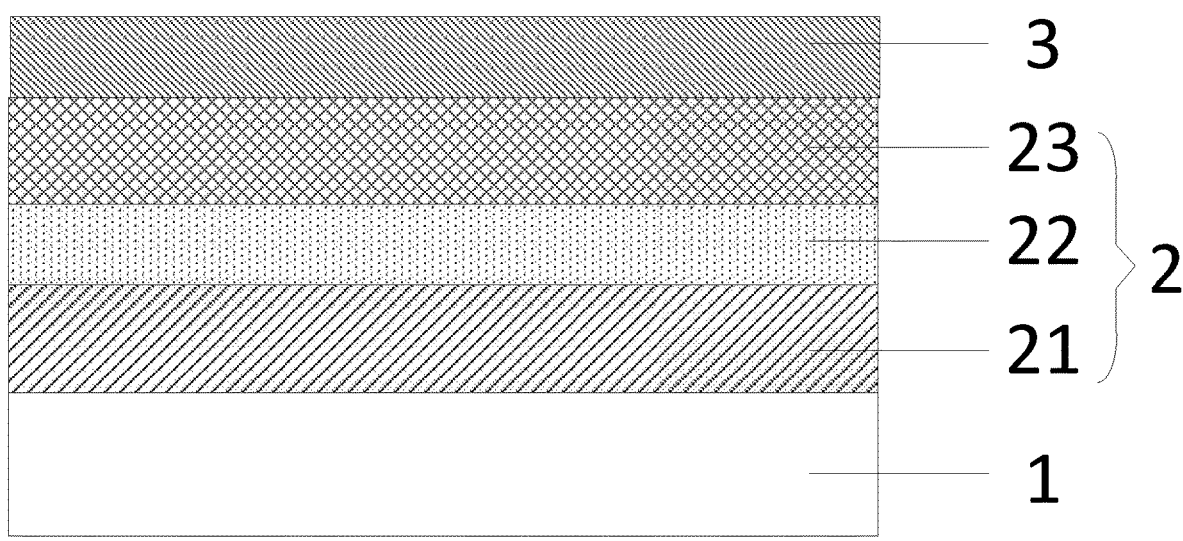
FIG. 4 is a third schematic structural diagram of a display panel according to an embodiment of the present application.

As shown in FIG. 4, the display panel according to the embodiment of the present application may further include a polarizing layer 3 on one side, away from the light-emitting device 1, of the encapsulation structure 2.

A material of the polarizing layer includes tetracene or F8BT.

In the display panel according to the embodiment of the present application, in the case that the encapsulation structure only includes the first inorganic layer for blocking moisture and oxygen and the fluoro-polymeric layer for blocking moisture and oxygen, the polarizing layer may be manufactured directly on the fluoro-polymeric layer for blocking moisture and oxygen since the fluoro-polymeric layer for blocking moisture and oxygen is located on one side away from the light-emitting device. Thereby, the process of attaching a polarizer in the later stage is saved. The polarizing layer may be formed by preparing oriented tetracene on the fluoro-polymeric layer for blocking moisture and oxygen using light-directed molecular self-assembly, or by preparing F8BT (a polymer of ethylene) using unidirectional blade-coating.

In the display panel according to the embodiment of the present application, the fluoro-polymeric layer for blocking moisture and oxygen may include an ultraviolet absorber.

In the display panel according to the embodiment of the present application, the ultraviolet absorber may be added into the fluoro-polymeric layer for blocking moisture and oxygen, so that the fluoro-polymeric layer for blocking moisture and oxygen may not only have a function for blocking moisture and oxygen, but also absorb the incident ultraviolet from ambient. As a result, the organic light-emitting layer in the light-emitting device is prevented from irradiation of the ultraviolet, thereby the stability of the light-emitting device is improved, and the service life of the light-emitting device is prolonged.

In an exemplary embodiment, an ultraviolet absorber in a predefined mass fraction may be added into and uniformly dispersed in the precursor solution with the fluoro-polymer already prepared. A film is uniformly formed with a solution in which the ultraviolet absorber is dissolved. The formed organic film layer can effectively absorb ultraviolet, and the ultraviolet stability of the light-emitting device is improved. The precursor solution of the fluoro-polymer may be formed by the acts mentioned in the above embodiments, which will not be repeated herein.

The ultraviolet absorber shall have a function of ultraviolet absorption and may be dissolved in the precursor solution of the fluoro-polymeric layer for blocking moisture and oxygen. For example, the ultraviolet absorber may be photoinitiator-1173 (Irgacure-1173).

In the display panel according to the embodiment of the present application, the dopant concentration of the ultraviolet absorber may be about 1%-20%.

In the display panel according to the embodiment of the present application, when the dopant concentration of the ultraviolet absorber is about 1%-20%, ultraviolet may be absorbed to various extents. The dopant concentration of the ultraviolet absorber may be set according to the requirements of the extent of ultraviolet absorption, which may be selected according to the practical situation of use, and is not limited here.

When the mass fraction of ultraviolet absorber in the precursor solution of the fluoro-polymer is 3%, the formed fluoro-polymeric layer for blocking moisture and oxygen may effectively absorb ultraviolet, so as to improve the ultraviolet stability of the light-emitting device.

Figure 5:
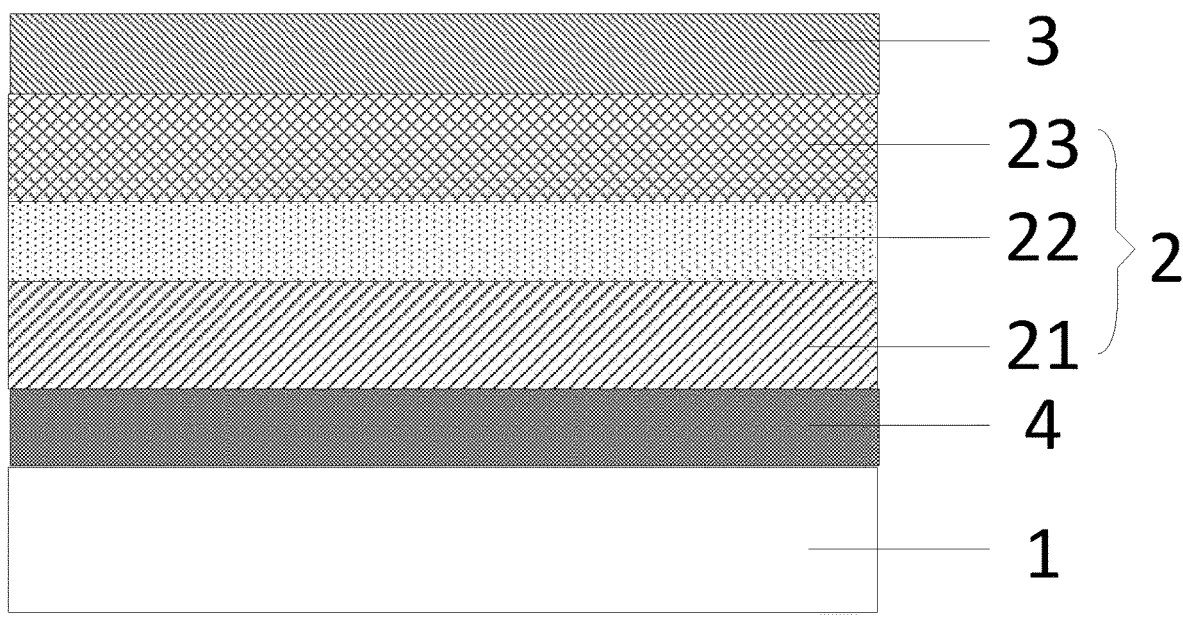
FIG. 5 is a fourth schematic structural diagram of a display panel according to an embodiment of the present application.

As shown in FIG. 5, the display panel according to the embodiment of the present application may further include a refractive layer 4 between the light-emitting device 1 and the encapsulation structure 2. The refractive layer 4 is arranged to improve the light output rate of the light-emitting device, and is generally selected from a material with a large refractive index and a small absorption coefficient. The refractive layer 4 may be a single layer or include a plurality of layers with different refractive indices, which is not limited here.

Based on the same inventive concept, an embodiment of the present application also provides a manufacturing method of a display panel. The manufacturing method includes: providing a substrate, and forming a light-emitting device on the substrate; forming a first inorganic layer for blocking moisture and oxygen on a light output surface on one side of the light-emitting device; and forming a fluoro-polymeric layer for blocking moisture and oxygen on the first inorganic layer for blocking moisture and oxygen.

A known manufacturing process of the display panel may be used in the process of forming the light-emitting device and the first inorganic layer for blocking moisture and oxygen may employ. The fluoro-polymeric layer for blocking moisture and oxygen may be formed by blade-coating or inkjet printing.

In the manufacturing method of the display panel according to the embodiment of the present application, forming the fluoro-polymeric layer for blocking moisture and oxygen on the first inorganic layer for blocking moisture and oxygen includes: mixing a chloro-trifluoro-ethylene vinyl ether resin and a difunctional methacrylic perfluoropolyether oligomer in a predefined mass ratio into a chloroform solvent to form a precursor solution of a fluoro-polymer; adding an ultraviolet absorber in a predefined mass fraction into the prepared precursor solution of the fluoro-polymer, and uniformly dispersing the ultraviolet absorber; and forming a film uniformly on the first inorganic layer for blocking moisture and oxygen with a solution in which the ultraviolet absorber is dissolved so as to form the fluoro-polymeric layer for blocking moisture and oxygen.

In the manufacturing method of the display panel according to the embodiment of the present application, the ultraviolet absorber may be added into the fluoro-polymeric layer for blocking moisture and oxygen, so that the fluoro-polymeric layer for blocking moisture and oxygen may not only have a function for blocking moisture and oxygen, but also absorb the incident ultraviolet from ambient. As a result, the organic light-emitting layer in the light-emitting device is prevented from irradiation of the ultraviolet, thereby the stability of the light-emitting device is improved, and the service life of the light-emitting device is prolonged.

The manufacturing method of the display panel according to the embodiment of the present application may further include: forming an oriented polarizing layer on one side, away from the light-emitting device, of the fluoro-polymeric layer for blocking moisture and oxygen.

In the manufacturing method of the display panel according to the embodiment of the present application, in the case that the encapsulation structure only includes the first inorganic layer for blocking moisture and oxygen and the fluoro-polymeric layer for blocking moisture and oxygen, the polarizing layer may be manufactured directly on the fluoro-polymeric layer for blocking moisture and oxygen since the fluoro-polymeric layer for blocking moisture and oxygen is located on one side away from the light-emitting device. Thereby, the process of attaching a polarizer in the later stage is saved. The polarizing layer may be formed by preparing oriented tetracene on the fluoro-polymeric layer for blocking moisture and oxygen using light-directed molecular self-assembly, or by preparing a polymer of ethylene using unidirectional blade-coating.

Figure 6:
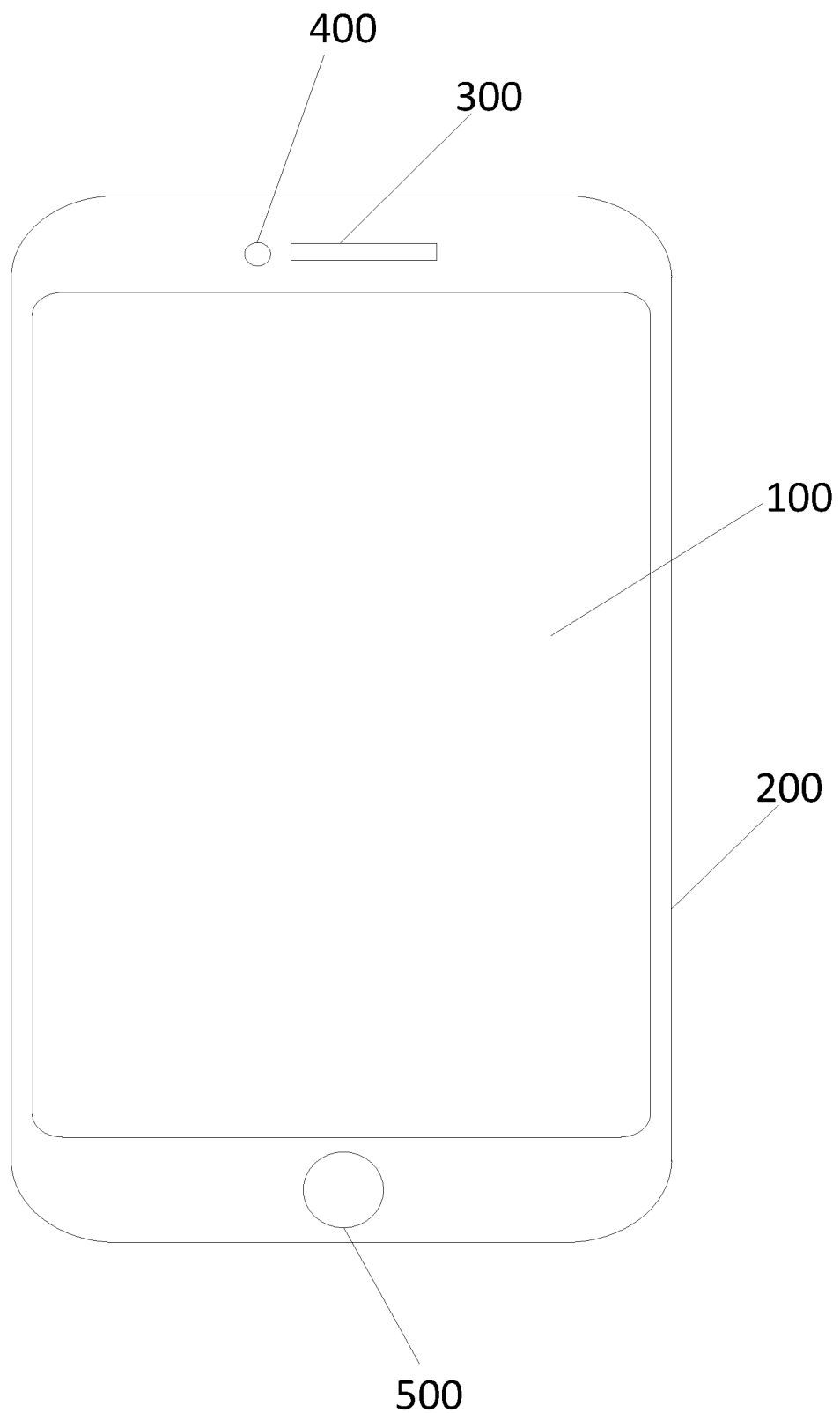
FIG. 6 is a schematic structural diagram of a display apparatus according to an embodiment of the present application.

Based on the same inventive concept, as shown in FIG. 6, an embodiment of the present application also provides a display apparatus including the display panel 100 according to any of the above embodiments.

The display apparatus may be any product with a display function, such as a mobile phone, a tablet computer, a television, a display, a notebook computer, a digital photo frame, or a navigator.

In the case that the display apparatus is a mobile phone, as shown in FIG. 6, the display apparatus includes not only the display panel 100, but also a protective casing 200 for protecting the display panel 100, a telephone receiver 300, a camera 400, and a main button 500 located in the non-active area of the display apparatus.

The display apparatus has the advantages of the display panel according to any of the above embodiments, which may be implemented with reference to the above embodiments of the display panel, and will not be described in detail herein.

A display panel, a manufacturing method thereof and a display apparatus are provided in embodiments of the present application. The display panel includes a light-emitting device on a substrate and an encapsulation structure on a light output surface on one side of the light-emitting device. The encapsulation structure includes a first inorganic layer for blocking moisture and oxygen and a fluoro-polymeric layer for blocking moisture and oxygen sequentially arranged on the light-emitting device. The fluoro-polymeric layer for blocking moisture and oxygen is arranged on the first inorganic layer for blocking moisture and oxygen. Since the fluoro-polymeric layer for blocking moisture and oxygen is an organic layer, it has better ductility and bending resistance than the inorganic layer. Moreover, the fluoro-polymeric layer for blocking moisture and oxygen has a function for blocking moisture and oxygen, and can prevent the service life of the light-emitting device from being affected by moisture and oxygen. Thereby, by virtue of the arrangement of the fluoro-polymeric layer for blocking moisture and oxygen, the thickness of the inorganic layer for blocking moisture and oxygen may be significantly decreased, and the bending resistance of the light-emitting device including the encapsulation structure may be improved.

Apparently, various modifications and variations to the present application may be made by those skilled in the art without departing from the spirit and scope of the present application. Thus, if these modifications and variations to the present application fall within the scope of the claims of the present application and their equivalent techniques, the present application is intended to include these modifications and variations.

What is claimed is:

1. A display panel comprising a light-emitting device on a substrate and an encapsulation structure on a light output surface on one side of the light-emitting device; the encapsulation structure comprising a first inorganic layer for blocking moisture and oxygen and a fluoro-polymeric layer for blocking moisture and oxygen sequentially arranged on the light-emitting device; wherein
   ductility and bending resistance of the fluoro-polymeric layer for blocking moisture and oxygen are greater than those of the first inorganic layer for blocking moisture and oxygen;
   defects between the fluoro-polymeric layer for blocking moisture and oxygen and the first inorganic layer for blocking moisture and oxygen are fewer than those between the first inorganic layer for blocking moisture and oxygen and another layer for blocking moisture and oxygen;
   thickness of the fluoro-polymeric layer for blocking moisture and oxygen and the first inorganic layer for blocking moisture and oxygen is less than that of the first inorganic layer for blocking moisture and oxygen and another layer for blocking moisture and oxygen; and
   bonding force between the fluoro-polymeric layer for blocking moisture and oxygen and the first inorganic layer for blocking moisture and oxygen is greater than that between the first inorganic layer for blocking moisture and oxygen and another layer for blocking moisture and oxygen.

2. The display panel of claim 1, wherein the encapsulation structure further comprises a second inorganic layer for blocking moisture and oxygen on one side, away from the light-emitting device, of the fluoro-polymeric layer for blocking moisture and oxygen; wherein
   defects between the fluoro-polymeric layer for blocking moisture and oxygen and the second inorganic layer for blocking moisture and oxygen are fewer than those between the second inorganic layer for blocking moisture and oxygen and another layer for blocking moisture and oxygen;
   thickness of the fluoro-polymeric layer for blocking moisture and oxygen and the second inorganic layer for blocking moisture and oxygen is less than that of the second inorganic layer for blocking moisture and oxygen and another layer for blocking moisture and oxygen; and
   bonding forces between the fluoro-polymeric layer for blocking moisture and oxygen and the first inorganic layer for blocking moisture and oxygen and between the fluoro-polymeric layer for blocking moisture and oxygen and the second inorganic layer for blocking moisture and oxygen are greater than those between the first inorganic layer for blocking moisture and oxygen and another layer for blocking moisture and oxygen and between the second inorganic layer for blocking moisture and oxygen and another layer for blocking moisture and oxygen.

3. The display panel of claim 2, wherein the thickness of both the first inorganic layer for blocking moisture and oxygen and the second inorganic layer for blocking moisture and oxygen is about 0.24 μm-1.2 μm.

4. The display panel of claim 1, wherein the thickness of the fluoro-polymeric layer for blocking moisture and oxygen is about 0.1 μm-5 μm.

5. The display panel of claim 1, further comprising a polarizing layer on one side, away from the light-emitting device, of the encapsulation structure.

6. The display panel of claim 5, wherein a material of the polarizing layer comprises tetracene or F8BT.

7. The display panel of claim 1, wherein the fluoro-polymeric layer for blocking moisture and oxygen comprises an ultraviolet absorber.

8. The display panel of claim 7, wherein the ultraviolet absorber is a photoinitiator-1173.

9. The display panel of claim 7, wherein a dopant concentration of the ultraviolet absorber is about 1%-20%.

10. The display panel of claim 1, further comprising a refractive layer between the light-emitting device and the encapsulation structure.

11. The display panel of claim 10, wherein the refractive layer is a single layer or comprises a plurality of layers with different refractive indices.

12. A display apparatus comprising the display panel of claim 1.

13. A display apparatus comprising the display panel of claim 2.

14. A display apparatus comprising the display panel of claim 5.

* * * * *